(12) United States Patent
Djordjevic et al.

(10) Patent No.: US 8,099,645 B2
(45) Date of Patent: Jan. 17, 2012

(54) LDPC CODES AND STOCHASTIC DECODING FOR OPTICAL TRANSMISSION

(75) Inventors: Ivan B. Djordjevic, Tucson, AZ (US); Lei Xu, Princeton, NJ (US); Ting Wang, Princeton, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 818 days.

(21) Appl. No.: 12/195,525

(22) Filed: Aug. 21, 2008

(65) Prior Publication Data

US 2009/0259912 A1    Oct. 15, 2009

Related U.S. Application Data

(60) Provisional application No. 61/044,086, filed on Apr. 11, 2008.

(51) Int. Cl.
*G06F 11/00*    (2006.01)
(52) U.S. Cl. ........................................ 714/752
(58) Field of Classification Search .................. 714/752
See application file for complete search history.

(56) References Cited

U.S. PATENT DOCUMENTS

| | | | | |
|---|---|---|---|---|
| 7,464,317 B2* | 12/2008 | Cameron et al. | | 714/755 |
| 2005/0144543 A1* | 6/2005 | Choi et al. | | 714/704 |
| 2006/0123318 A1* | 6/2006 | Kim et al. | | 714/758 |
| 2008/0077839 A1* | 3/2008 | Gross et al. | | 714/755 |
| 2008/0195898 A1* | 8/2008 | Savin | | 714/699 |
| 2008/0222499 A1* | 9/2008 | Hung et al. | | 714/801 |
| 2008/0294970 A1* | 11/2008 | Gross et al. | | 714/801 |
| 2011/0055655 A1* | 3/2011 | Hocevar | | 714/752 |
| 2011/0072336 A1* | 3/2011 | Shen et al. | | 714/800 |

OTHER PUBLICATIONS

Winstead et al., Stochastic Iterative Decoders; arXiv:cs/0501090v1; Jan. 30, 2005; 6 pages.
Tehrani et al., Stochastic Decoding of LDPC Codes; IEEE Communications Letters, vol. 10, No. 10; Oct. 2006; pp. 716-718.

* cited by examiner

*Primary Examiner* — Bryce Bonzo
(74) *Attorney, Agent, or Firm* — James Bitetto; Joseph Kolodka

(57) ABSTRACT

A method for error correction and a decoder using low density parity check (LDPC) codes includes initializing extrinsic probability information between variable nodes and check nodes in a bipartite graph including generating a Bernoulli sequence according to a probability of a bit having a value one. Parity checking is performed in accordance with a parity check equation. If the parity check equation is not satisfied, then extrinsic information is updated in check nodes from variable nodes using a parity node update logic circuit in a first half iteration, extrinsic information is updated in variable nodes from check nodes using a variable node update logic circuit in a second half iteration, and the variable nodes are updated with a probability based upon the extrinsic information passed between check nodes and variable nodes wherein the probability represents a likelihood that an ith bit is a one. Information bits are passed when the parity check equation is satisfied or a predetermined number of iterations has been reached.

25 Claims, 5 Drawing Sheets

_(1)_

LDPC CODES AND STOCHASTIC DECODING FOR OPTICAL TRANSMISSION

RELATED APPLICATION INFORMATION

This application claims priority to provisional application Ser. No. 61/044,086 filed on Apr. 11, 2008 incorporated herein by reference.

BACKGROUND

1. Technical Field

The present invention relates to optical data transmission systems and methods and more particularly to forward error correction (FEC) in optical systems at data rates at or above 100 Gb/s.

2. Description of the Related Art

Stochastic arithmetic was introduced in 1960's, as an option for the implementation of low-precision digital circuits. Because the optical signal transmission at 100 Gb/s and above is severely deteriorated by impact of intrachannel nonlinearities and polarization-mode dispersion (PMD), the use of forward error correction (FEC) is of great importance.

There are two approaches proposed so far. In a first approach, it has been proposed to use a generalized low-density parity check (LDPC) codes with component Reed Solomon (RS) codes. This scheme provides excellent coding gains, but it is based on hard-decision decoding, and the decoding latency is high.

In a second approach, the use of LDPC codes with 2 bits precision for soft-decoding has been proposed, but relies on the possibility of analog to digital (A/D) converters operating above 100 Gb/s. This type of converter is no currently available. Moreover, the second approach employs a very simple decoding algorithm which introduces error floor at very low bit error rates (BERs). To solve that problem they had to use an additional RS code as an outer code.

SUMMARY

Given the lack of A/D converters operating at data rates $\geq 100$ Gb/s, the present principles provide a forward error correction (FEC) system and method based on stochastic low density parity check (LDPC) decoding that can operate at such speeds.

A method for error correction and a decoder using low density parity check (LDPC) codes includes initializing extrinsic probability information between variable nodes and check nodes in a bipartite graph including generating a Bernoulli sequence according to a probability of a bit having a value (e.g., one). Parity checking is performed in accordance with a parity check equation. If the parity check equation is not satisfied, then extrinsic information is updated in check nodes from variable nodes using a parity node update logic circuit in a first half iteration, extrinsic information is updated in variable nodes from check nodes using a variable node update logic circuit in a second half iteration, and the variable nodes are updated with a probability based upon the extrinsic information passed between check nodes and variable nodes wherein the probability represents a likelihood that an ith bit is a one. Information bits are passed when the parity check equation is satisfied.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1B:
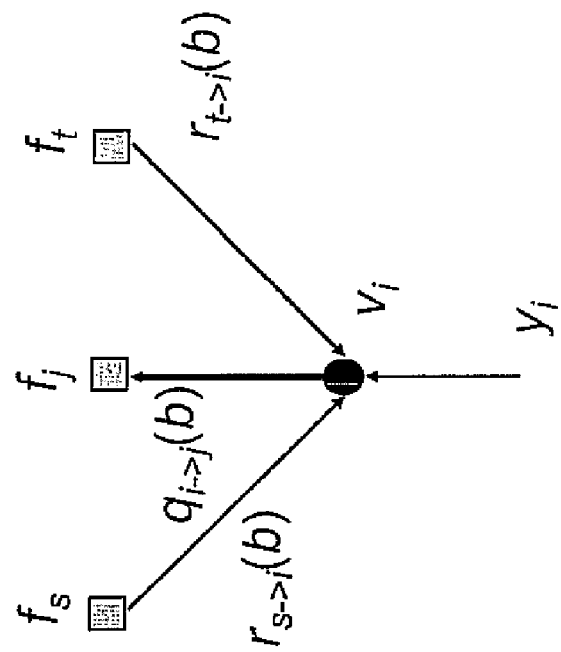
FIG. 1B is a diagram showing a process for computing extrinsic probabilities in a variable node.

Given the lack of analog to digital (A/D) converters operating at data rates $\geq 100$ Gb/s, the present principles provide a forward error correction (FEC) system and method based on stochastic low density parity check (LDPC) decoding that can operate at such speeds. By employing the stochastic representation, complex operations on probabilities, such as the multiplication and division, needed in sum-product low density parity check (LDPC) decoding methods can be implemented using simple Boolean functions. The Boolean functions may include the same functions used in hard-decision decoding. Stochastic LDPC decoding can provide near sum-product decoding performance for girth-6 codes. Selecting this decoding approach provides an excellent candidate for 100 Gb/s or greater implementations.

A high-speed optical transmission system operating above 100 Gb/s is severely limited by polarization-mode dispersion (PMD) and intrachannel nonlinearities. The development of a novel powerful forward error correction (FEC) system and method suitable for beyond 100 Gb/s transmission and 100 Gb/s Ethernet is of great utility. To keep the bit error rate (BER) quality for those systems comparable to that of standard RS(255,239) FEC schemes operating at 40 Gb/s a FEC scheme providing at least 4 dB improvement in coding gain is needed.

Embodiments described herein may be entirely hardware, entirely software or including both hardware and software elements. In a preferred embodiment, the present invention is preferably implemented in a combination of hardware and software. The software may include but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable medium such as a semiconductor or solid state memory, magnetic tape, a removable computer diskette, a random access memory (RAM), a read-only memory (ROM), a rigid magnetic disk and an optical disk, etc.

Main problems related to stochastic LDPC decoding include the hold-state problem, the applicability to only degree-3 variable and check nodes in parity-check matrix of an LDPC code, and error floor phenomena. In one illustrative implementation, to solve the first problem, we propose to implement a second half-iteration of the sum-product algorithm (SPA) using 3-bit precision, while implementing the rest using stochastic logic. To solve the degree-3 node problem, instead of introducing the hidden states that lead to increased complexity of a bipartite graph, we propose a modified stochastic decoding algorithm that is applicable to arbitrary degree nodes, without any change in the bipartite graph. The LDPC codes exhibit error floor phenomena. Because the girth-10 LDPC codes do not exhibit error floor down to BER of $10^{-15}$, we design a girth-10 LDPC code of rate 0.8 suitable for above 100-Gb/s implementation.

A stochastic sum-product algorithm (SPA) can be described as follows. The motivation for using stochastic decoding includes the possibility of performing two basic probability-domain sum-product algorithm (SPA) operations, the multiplication and division of probabilities, using simple Boolean circuitry. In stochastic decoding, the probability P is represented by a Bernoulli sequence of length N with probability of ones being P=m/N, where m is the number of ones. The SPA is an iterative LDPC decoding algorithm in which extrinsic probabilities are iterated forward and back between variable and check nodes of a bipartite (Tanner) graph representation of a parity-check matrix.

Figure 1A:
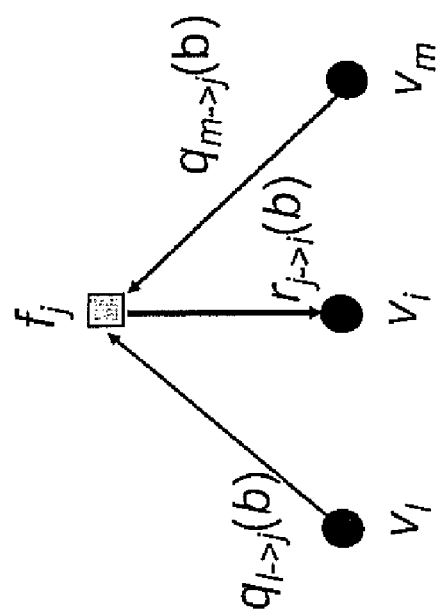
FIG. 1A is a diagram showing a process for computing extrinsic probabilities in a check node.

Referring now in detail to the figures in which like numerals represent the same or similar elements and initially to FIGS. 1A and 1B, a process for creating extrinsic probabilities in variable and check node processing is illustratively depicted. FIG. 1A shows the computation of a process for extrinsic probabilities for a check node, and FIG. 1B shows the computation of a process for extrinsic probabilities for a variable node. The circles in FIGS. 1A and 1B denote the variable nodes involved in an $f_j$ parity-check equation (jth row in corresponding parity-check matrix with ones indicating the variable nodes involved in that parity-check equation, denoted by square). $q_{i \to j}(b)$ denotes the extrinsic information (message) to be passed from variable node $v_i$ to function node $f_j$ regarding the probability that $v_i = b$, $b \in \{0,1\}$. $r_{j \to i}(b)$ denotes the extrinsic information to be passed from function node $f_j$ to variable node $v_i$ and represents the probability that jth parity-check equation is satisfied given $v_i = b$, and other bits connected to the same function node have a separable distribution given by $\{q_{i \to j}\}_{j' \ne j}$. Before the stochastic sum-product algorithm begins, we have to calculate the bit log-likelihood ratios (LLRs)

$$L(v_i) = \log\left[\frac{Pr(v_i = 0 \mid y_i)}{Pr(v_i = 1 \mid y_i)}\right]; i = 1, 2, \ldots, n,$$

where $L(v_i)$ denotes LLR of ith bit $v_i$, in code word v of length n, and $y_i$ is corresponding receiver sample.

Figure 2:
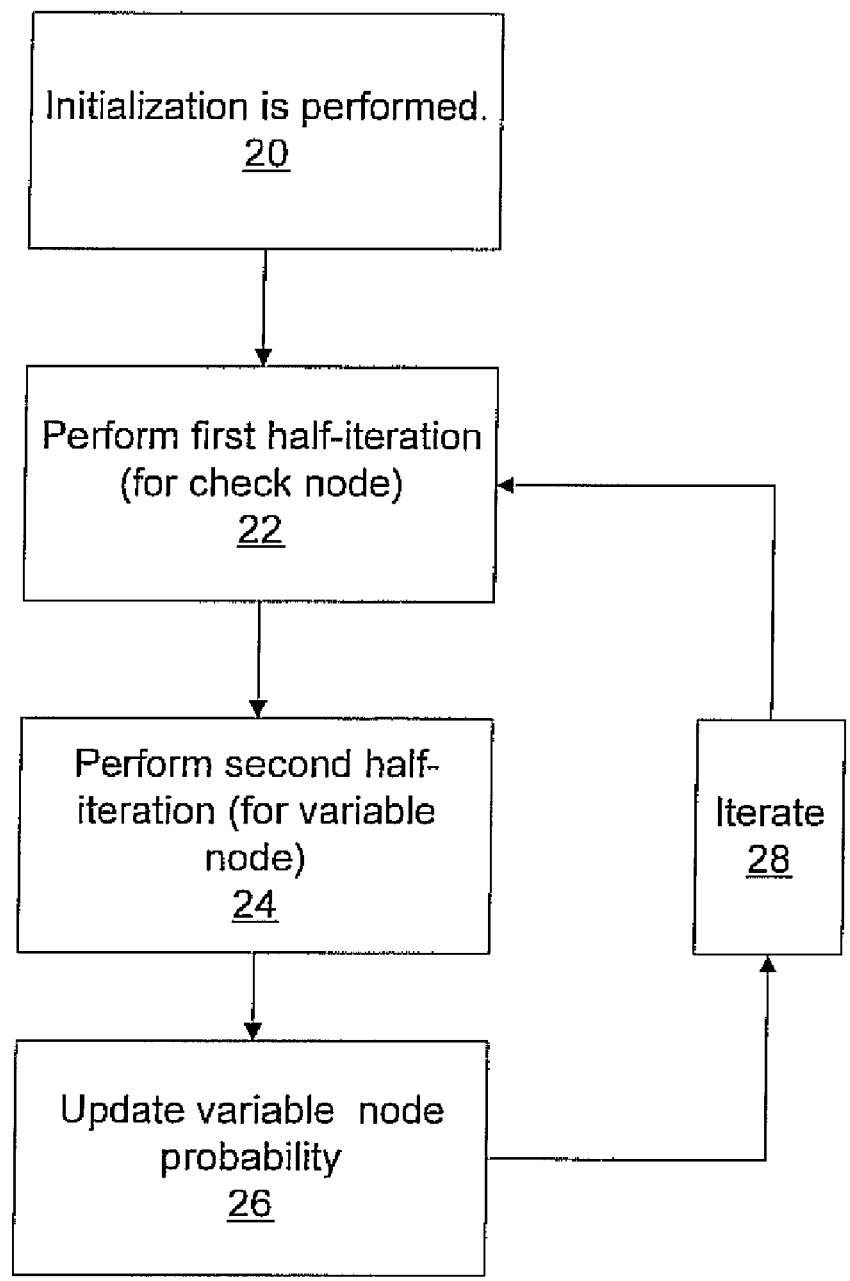
FIG. 2 is a block/flow diagram for a system/method showing steps for performing stochastic a sum-product algorithm (SPA) in accordance with one embodiment.

Referring to FIG. 2, a SPA method is illustratively shown with continued reference to FIGS. 1A and 1B. In block 20, initialization is preformed. This includes computing extrinsic information (messages) $q_{i \to j} = P_i = [1 + \exp(L(v_i))]^{-1}$. In block 22, a first half-iteration is performed which includes computing check node (r) extrinsic information. For example, $r_{j \to i} = q_{l \to j}(1 - q_{l \to j}) + (1 - q_{l \to j})q_{m \to j}$ (see FIG. 3A). In block 24, a second half-iteration is performed. For example, $q_{i \to j} = r_{s \to i} r_{t \to i} / [r_{s \to i} r_{t \to i} + (1 - r_{s \to i})(1 - r_{t \to i})]$ (See FIG. 3B). In block 26, a variable-node update is performed. E.g., $$P_i \leftarrow \frac{r_{s \to i} r_{t \to i}}{r_{s \to i} r_{t \to i} + (1 - r_{s \to i})(1 - r_{t \to i})},$$

$$P_i \leftarrow \frac{P_i r_{j \to i}}{P_i r_{j \to i} + (1 - P_i)(1 - r_{j \to i})}.$$

In block 28, repeat the steps in block 22, 24 and 26 until the estimated code word v satisfies the parity-check equation $vH^T = 0$ (where H is the parity-check matrix) or pre-determined number of iterations has been reached.

In the case when the variable and check node degrees are larger than 3, we have to implement the steps in block 22 and 24 in a similar fashion as in step 26. In such a way, we do not need to modify the bipartite graph by introducing the hidden states, as it was done before, so that all check and variable nodes are of degree 3. Notice that in the initialization in block 20, only probabilities $r_{j \to i}$ and $q_{i \to j}$ are to be memorized in blocks 22 and 24, while in standard SPA the four probabilities are required (i.e., $r_{j \to i}(0), r_{j \to i}(1), q_{i \to j}(0)$ and $q_{i \to j}(1)$), plus the normalization in block 22, 24 and 26 is needed. Block 22, 24 and 26 are performed by logic circuits 30 and 40 given in FIGS. 3A and 3B, respectively.

Figure 3A:
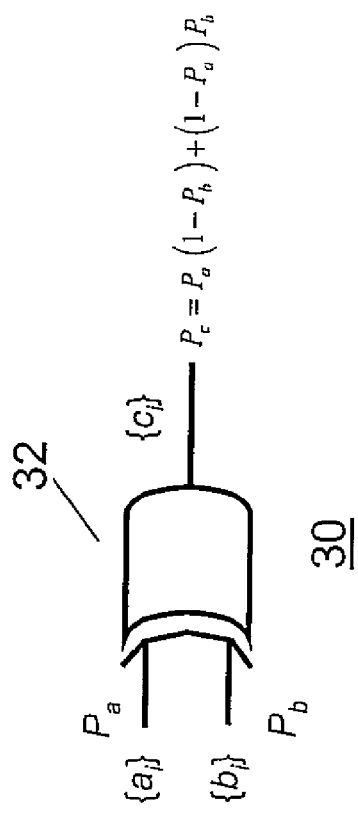
FIG. 3A is a schematic diagram of a parity-check node probability update circuit in accordance with one embodiment.
Figure 3B:
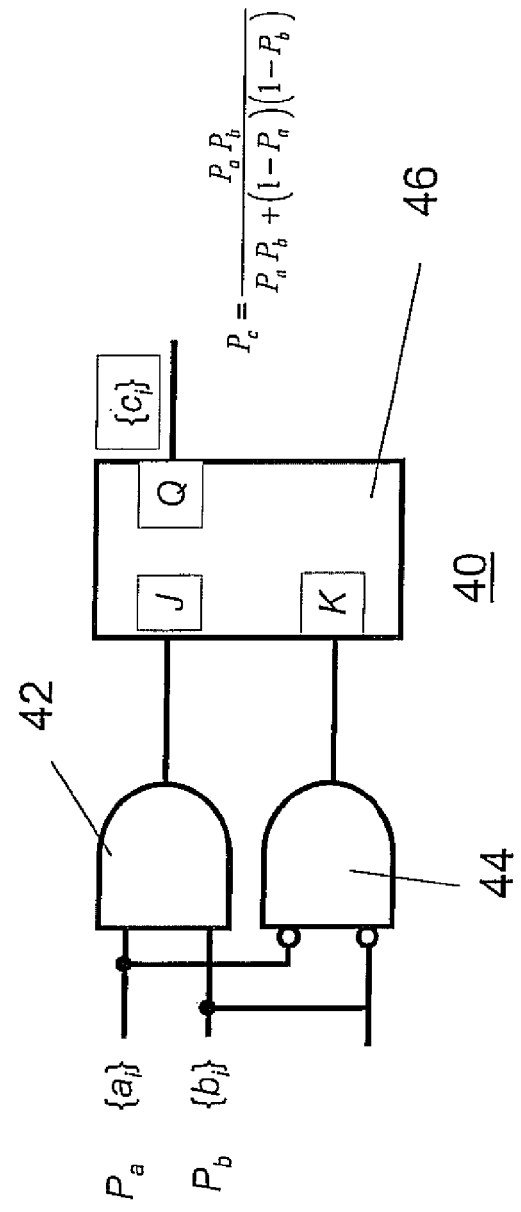
FIG. 3B is a schematic diagram of a variable node probability update circuit in accordance with one embodiment.

With reference to FIGS. 3A and 3B, instead of calculating the probabilities as given in blocks 22 and 24, we generate Bernoulli sequences having the probability of ones $P_a = m_a/N$ and $P_b = m_b/N$, where $m_a$ and $m_b$ denote the number of ones in sequences $\{a_i\}$ and $\{b_i\}$, respectively; both of length N. Those sequences are used as inputs to the circuits 30 and 40 shown in FIGS. 3A and 3B and correspond to blocks 22 and 24 of FIG. 2, respectively.

FIG. 3A includes an EXOR gate 32, and FIG. 3B includes an AND gate 42, an AND gate 44 with complemented inputs and a JK flip-flop 46. The output of circuit 30 provides $P_c = P_a(1 - P_b) + (1 - P_a)P_b$ for inputs $P_a$ and $P_b$. The output of circuit 40 provides $$P_c = \frac{P_a P_b}{P_a P_b + (1 - P_a)(1 - P_b)}$$

for inputs $P_a$ and $P_b$.

Notice that the stochastic decoding may introduce the larger decoding latency than conventional SPA, but it is much easier to implement, even in the lack of high-precision, making it suitable for implementation at high-speeds.

A major difficulty related to stochastic decoding includes the latching (hold-state) problem of circuit shown in FIG. 3B, in which the bipartite graph correlates the probability messages so that a group of nodes are locked into a fixed state. To deal with this problem the concepts of supernodes, scaling channel LLRS, and randomization by edge memories have been introduced. However, those approaches lead to conventional SPA approaching performance of girth-4 and girth-6 LDPC codes only, but face significant performance loss for large girth codes. Because the girth-4 and girth-6 exhibit error floor phenomena, we have to use large girth (8 or 10) LDPC codes. To solve the performance loss due to the latching problem in large-girth LDPC codes, we provide a second-half iteration with 3-bit precision, and all other steps with stochastic logic.

Figure 4:
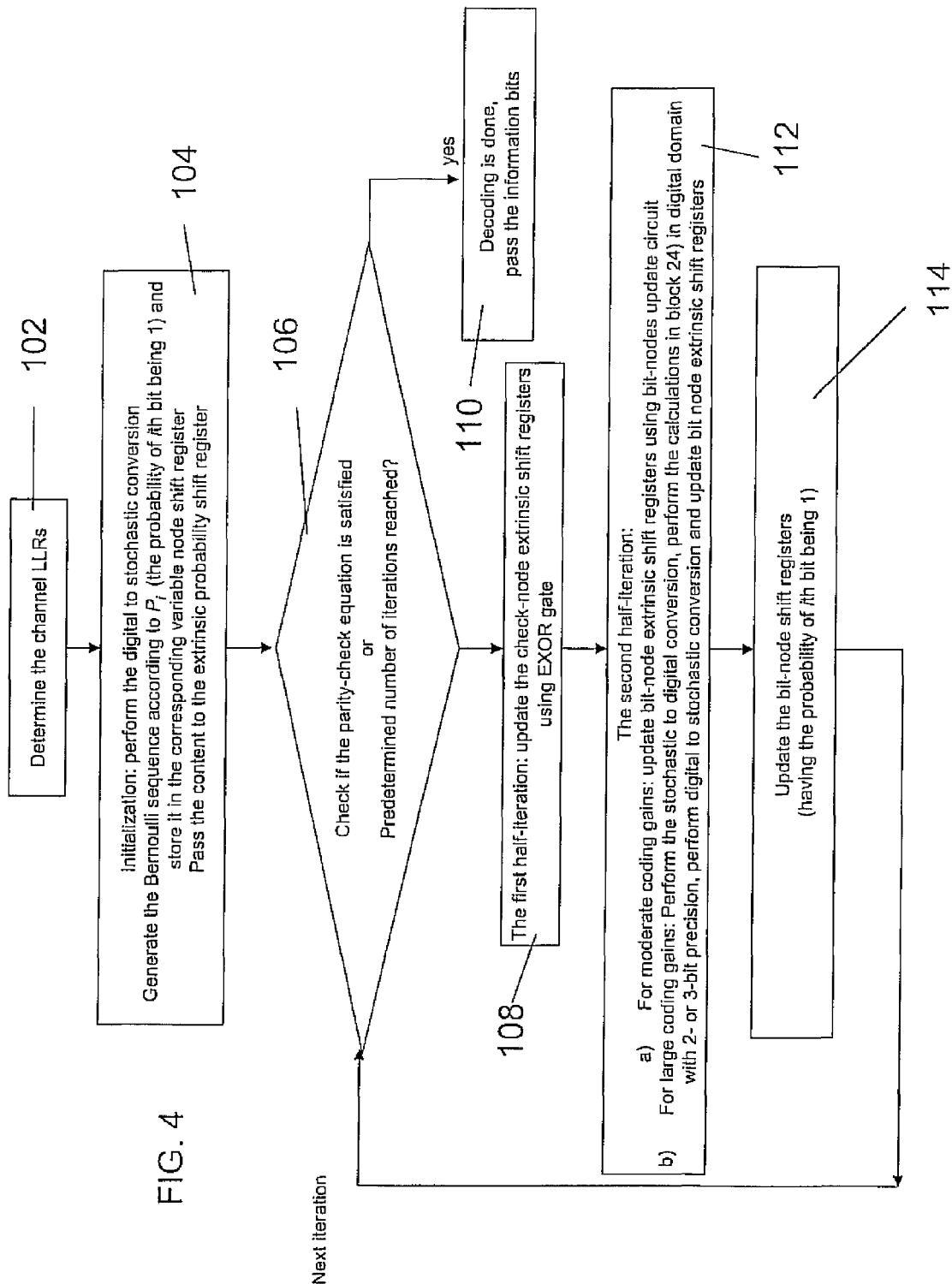
FIG. 4 is a block/flow diagram for a system/method for decoding LDPC codes in accordance with one illustrative embodiment.

Referring to FIG. 4, a system/method for stochastic decoding of LDPC codes is illustratively depicted. In block 102, channel LLRs are determined (e.g., $L(v_i)$). In block 104, an initialization step is preformed. This includes performing a digital to stochastic conversion. A Bernoulli sequence according to $P_i$ (the probability of the ith bit being 1) is generated, and the sequence is stored in a corresponding variable node shift register. The content is passed to an extrinsic probability shift register.

In block 106, a check is performed on whether a parity check equation has been satisfied (or if a predetermined number of iterations have been reached). For example, the estimated code word v satisfies the parity-check equation $vH^T=0$ (where H is the parity-check matrix) or pre-determined number of iterations has been reached. To solve the error floor phenomena problem, we employ large girth (e.g., around 10) LDPC codes. The parity check-matrix H of quasi-cyclic LDPC codes can be represented by:

$$H = \begin{bmatrix} I & I & I & \ldots & I \\ I & P^{S[1]} & P^{S[2]} & \ldots & P^{S[c-1]} \\ I & P^{2S[1]} & P^{2S[2]} & \ldots & P^{2S[c-1]} \\ \ldots & \ldots & \ldots & \ldots & \ldots \\ I & P^{(r-1)S[1]} & P^{(r-1)S[2]} & \ldots & P^{(r-1)S[c-1]} \end{bmatrix}, \quad (1)$$

where I is p×p (p is a
prime number) identity matrix, P is a p×p permutation matrix ($p_{i,i+1}=p_{p,1}=1$, i=1, 2, ..., p−1; other elements of P are zeros), while r and c represent the number of rows and columns in (1), respectively. The set of integers S are to be carefully chosen from the set $\{0, 1, \ldots, p-1\}$ so that the cycles of short length, in corresponding Tanner (bipartite) graph representation of (1) are avoided. To do so we develop and perform an efficient search. For example, by selecting p=1123 and S={0, 2, 5, 13, 20, 37, 58, 91, 135, 160, 220, 292, 354, 712, 830} an LDPC code of rate 0.8, girth g=10, column weight 3 and length N=16845 is obtained, for example. Advantageously, the soft iterative decoding of LDPC codes can be implemented using stochastic decoding.

Stochastic decoding uses Boolean logic circuits, the same circuits used in hard-decoding. Given the fact that A/D converters operating above 100 Gb/s do not exist (even if they appear soon they will have a limited precision), this approach is an excellent candidate for providing strong FEC correction capability for beyond 100 Gb/s optical transmission and 100 Gb/s Ethernet.

If in block 106, if the parity check is satisfied (or the number of iterations has hit its threshold), then the decoding is complete, and the information bits can be passed in block 110. In block 108, a first half-iteration is performed. The check node extrinsic shift registers are updated using an EXOR gate (see e.g., FIG. 3A) and block 22 of FIG. 2). In block 112, a second half-iteration is performed. This includes for moderate coding gains (e.g., up to 9.5 dB), updating bit node extrinsic shift registers using a bit node update circuit (see FIG. 3B). For large coding gains (e.g., above about 10 dB), perform a stochastic to digital conversion by performing the computations in block 24 in the digital domain with 2 or 3 bit precision. Perform digital to stochastic conversion and update bit node extrinsic shift registers.

In block 114, update the bit node shift registers (which include the probability ($P_i$) for the ith bit being 1). This is performed in a way similar way as described above with respect to block 26 (FIG. 2).

The main problems related to stochastic LDPC decoding and to application of LDPC codes for beyond 100 Gb/s transmission are: (i) the hold-state problem, (ii) the applicability to degree-3 variable and check nodes in parity-check matrix of an LDPC code, and (iii) error floor phenomena. To solve the first problem, we propose to implement the second half-iteration of SPA using 2- or 3-bit precision, while implementing the rest using the stochastic logic (Boolean logic circuits). To solve the degree-3 node problem, instead of introducing the hidden states, which leads to increased complexity of the bipartite graph, we propose a modified stochastic decoding algorithm, described above, that is applicable to arbitrary degree nodes, without any change in the bipartite graph. LDPC codes may exhibit the error floor phenomena. However, because the girth-10 LDPC codes do not exhibit error floor down to BER of $10^{-15}$, we design the girth-10 LDPC codes of rate $\geq 0.8$ suitable for above 100-Gb/s implementation.

Figure 5:
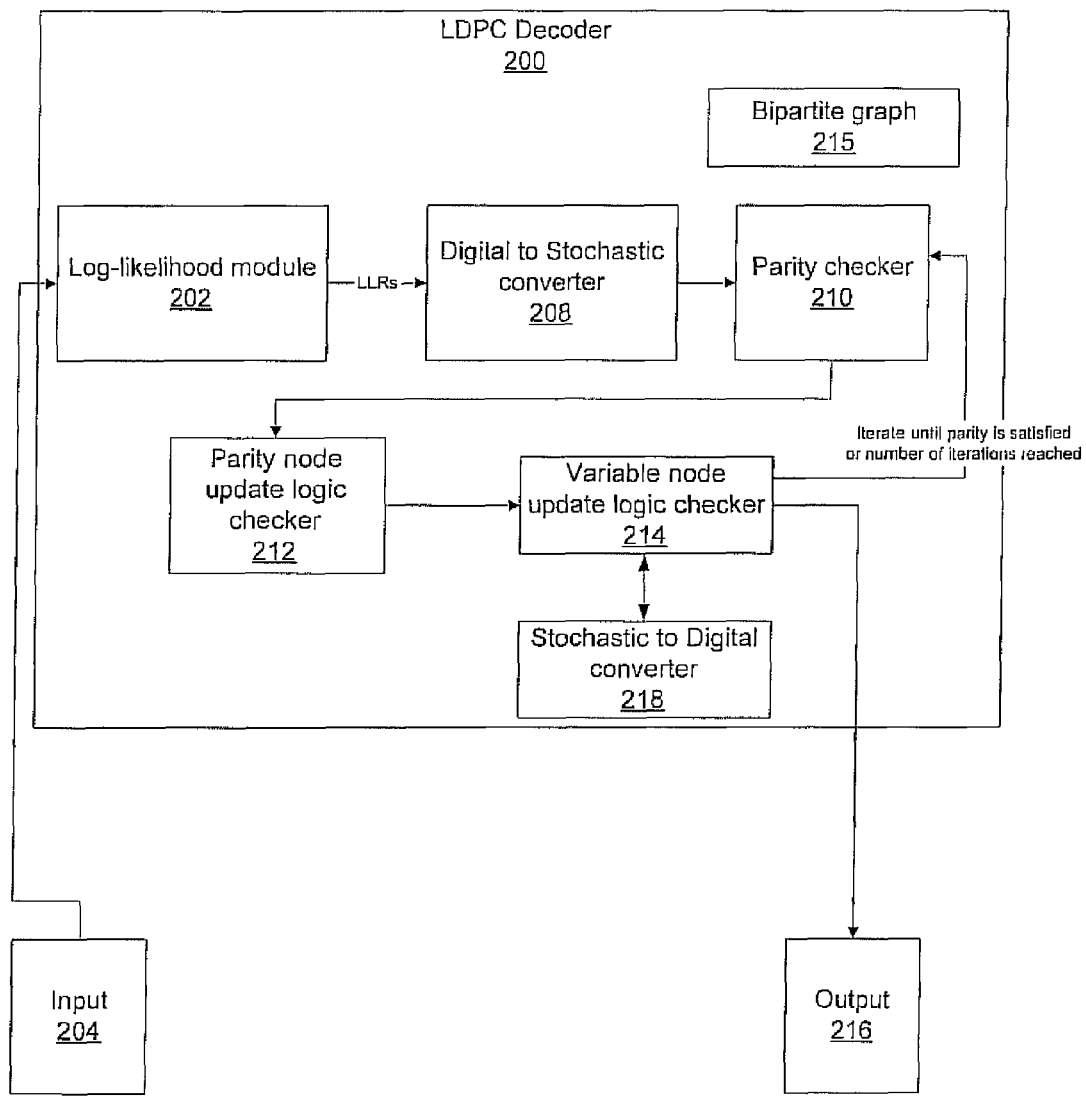
FIG. 5 is schematic diagram illustratively showing a LDPC decoder in accordance with one illustrative embodiment.

Referring to FIG. 5, a LDPC code decoder 200 is illustratively depicted in accordance with one illustratively embodiment. A log-likelihood ratio (LLR) module 202 is configured to compute log-likelihood ratios based on input sequences from an input 204. A digital to stochastic converter 208 is configured to initialize extrinsic probability information between variable nodes and check nodes in a bipartite graph 215 by generating a Bernoulli sequence according to a probability of a bit having a value one. A parity checker 210 is configured to check parity in accordance with a parity check equation.

A parity node update logic circuit 212 is configured to update extrinsic information in check nodes from variable nodes in a first half iteration if the parity check equation is not satisfied. A variable node update logic circuit 214 is configured to update extrinsic information in variable nodes from check nodes in a second half iteration if the parity check equation is not satisfied. The variable node update logic circuit 214 is further configured to update the variable nodes with a probability based upon the extrinsic information passed between check nodes and variable nodes wherein the probability represents a likelihood that an ith bit is a one. Updating extrinsic information in variable nodes from check nodes in the second half iteration may include, for a first level of gains, a variable node update logic circuit is employed, and for a second level of gains, stochastic to digital conversion 218 is performed and the update computations are performed in a digital domain using a fixed bit precision (e.g., 2-3 bit precision). An output 216 is configured to pass information bits when the parity check equation is satisfied.

A modified stochastic LDPC decoding method has been provided suitable for implementation at 100-Gb/s and above. The stochastic decoding is particularly useful for low-precision digital circuits, and as such is suitable for beyond 100-Gb/s implementation to avoid the problem of the nonexistence of high-precision analog-to-digital converters operating at those speeds.

The soft decoding FEC for high-speed optical communications systems operating above 100 Gb/s and for 100 Gb/s Ethernet is not possible because A/D converters operating at 100 Gb/s do not exist. They may appear in near future, but the number of bits cannot exceed 2 or 3 bits. The stochastic decoding provides a solution by representing the probability of one by number of ones in a Bernoulli sequence of a certain length. By using this representation, the complex operations on probabilities, such as the multiplication and division, needed in sum-product LDPC decoding can be implemented using simple Boolean functions. By using the present principles, we are able to achieve the coding gains comparable to conventional soft iteratively decodable algorithm (sum-product algorithm) by implementing certain steps using Boolean logic only and certain steps using the conventional approach with only 2 or 3 bit precision.

The results of simulations for an additive white Gaussian noise (AWGN) channel model were performed. We compared girth-10 quasi-cyclic LDPC codes against RS, concatenated RS, turbo-product, and girth-8 LDPC codes. The results of simulations were obtained for 30 iterations, and Bernoulli sequence length of 1000. The girth-10 LDPC (24015,19212) code of rate 0.8 outperformed the concatenation RS(255,239)+RS(255,223) (of rate 0.82) by 3.35 dB, and RS(255,239) by 4.75 dB, both at BER of $10^{-7}$. At BER of $10^{-10}$ it outperforms lattice based LDPC(8547,6922) of rate 0.81 and girth-8 by 0.44 dB, and BCH(128,113)×BCH(256, 239) turbo-product code of rate 0.82 by 0.95 dB. The net effective coding gain at BER of $10^{-12}$ is 10.95 dB.

Therefore, the modified stochastic LDPC decoding is suitable for high-speed implementation, at 100-Gb/s and above. Given the lack of A/D converters operating at or above 100-Gb/s, the stochastic decoding seems to be a good option for implementation at those speeds. We propose a version of stochastic decoding algorithm that is applicable to arbitrary column- and row-weight. To avoid the error floor problem inherent in LDPC decoding we employ girth-10 quasi-cyclic codes. To solve the hold-state problem, we implement the second half-iteration step with 3 bit precision, and the rest using the stochastic logic.

Having described preferred embodiments for LDPC codes and stochastic decoding for optical transmission (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for error correction using low density parity check (LDPC) codes, comprising:
    initializing extrinsic probability information between variable nodes and check nodes in a bipartite graph including generating a Bernoulli sequence according to a probability of a bit having a value one;
    checking parity in accordance with a parity check equation;
    if the parity check equation is not satisfied, then:
        updating extrinsic information in check nodes from variable nodes using a parity node update logic circuit in a first half iteration;
        updating extrinsic information in variable nodes from check nodes using a variable node update logic circuit in a second half iteration; and
        updating the variable nodes with a probability based upon the extrinsic information passed between check nodes and variable nodes of wherein the probability represents a likelihood that an ith bit is a one; and
    passing information bits when the parity check equation is satisfied.

2. The method as recited in claim 1, further comprising computing log likelihoods ratios (LLRs) of codewords.

3. The method as recited in claim 2, wherein the LLRs are employed to compute the extrinsic probability information.

4. The method as recited in claim 1, wherein the parity node update logic circuit includes an EXOR gate and updating extrinsic information in check nodes includes EXORing Bernoulli sequences to update the probability.

5. The method as recited in claim 1, wherein the variable node update logic circuit includes a AND gates and a latch and updating extrinsic information in variable nodes includes ANDing and latching Bernoulli sequences to update the probability.

6. The method as recited in claim 1, wherein the second half iteration is performed with 2 or 3 bit precision.

7. The method as recited in claim 1, wherein if the parity check equation is not satisfied, then iterating until the parity check equation is satisfied or a number of iterations have been performed.

8. The method as recited in claim 1, wherein checking parity includes checking whether a code word v satisfies the parity-check equation $vH^T=0$ (where H is a parity-check matrix).

9. The method as recited in claim 8, further comprising employing a LDPC codes with a girth of at least 10 wherein the parity check-matrix H of quasi-cyclic LDPC codes is represented by:

$$H = \begin{bmatrix} I & I & I & \ldots & I \\ I & P^{S[1]} & P^{S[2]} & \ldots & P^{S[c-1]} \\ I & P^{2S[1]} & P^{2S[2]} & \ldots & P^{2S[c-1]} \\ \ldots & \ldots & \ldots & \ldots & \ldots \\ I & P^{(r-1)S[1]} & P^{(r-1)S[2]} & \ldots & P^{(r-1)S[c-1]} \end{bmatrix}, \quad (1)$$

where I is p×p (p is a prime number) identity matrix, P is a p×p permutation matrix ($p_{i,i+1}=p_{p,1}=1$, i=1, 2, . . . , p−1; other elements of P are zeros), while r and c represent the number of rows and columns in (1), respectively, and S is a set of integers.

10. The method as recited in claim 9, wherein the set of integers are selected from a set $\{0, 1, \ldots, p-1\}$ so that cycles of short length in a corresponding (bipartite) graph representation of H are avoided.

11. A method for error correction using low density parity check (LDPC) codes, comprising:
    performing a digital to stochastic conversion by initializing extrinsic probability information between variable nodes and check nodes in a bipartite graph including generating a Bernoulli sequence according to a probability of a bit having a value;
    checking parity in accordance with a parity check equation;
    if the parity check equation is not satisfied, then:
        updating extrinsic information in check nodes from variable nodes using a parity node update logic circuit in a first half iteration;
        updating extrinsic information in variable nodes from check nodes in a second half iteration wherein for a first level of gains a variable node update logic circuit is employed and wherein for a second level of gains, stochastic to digital conversion is performed and the update computations are performed in a digital domain using a fixed bit precision; and
        updating the variable nodes with a probability based upon the extrinsic information passed between check nodes and variable nodes wherein the probability represents a likelihood that an ith bit is a one; and passing information bits when the parity check equation is satisfied.

12. The method as recited in claim 11, further comprising computing log likelihoods ratios (LLRs) of codewords.

13. The method as recited in claim 12, wherein the LLRs are employed to compute the extrinsic probability information.

14. The method as recited in claim 11, wherein the parity node update logic circuit includes an EXOR gate and updating extrinsic information in check nodes includes EXORing Bernoulli sequences to update the probability.

15. The method as recited in claim 11, wherein the variable node update logic circuit includes a AND gates and a latch and updating extrinsic information in variable nodes includes ANDing and latching Bernoulli sequences to update the probability.

16. The method as recited in claim 11, wherein the fixed precision includes a 2 or 3 bit precision.

17. The method as recited in claim 11, wherein if the parity check equation is not satisfied, then iterating until the parity check equation is satisfied or a number of iterations have been performed.

18. The method as recited in claim 11, wherein checking parity includes checking whether a code word v satisfies the parity-check equation $vH^T=0$ (where H is a parity-check matrix).

19. The method as recited in claim 18, further comprising employing a LDPC codes with a girth of at least 10 wherein the parity check-matrix H of quasi-cyclic LDPC codes is represented by:

$$H = \begin{bmatrix} I & I & I & \ldots & I \\ I & P^{S[1]} & P^{S[2]} & \ldots & P^{S[c-1]} \\ I & P^{2S[1]} & P^{2S[2]} & \ldots & P^{2S[c-1]} \\ \ldots & \ldots & \ldots & \ldots & \ldots \\ I & P^{(r-1)S[1]} & P^{(r-1)S[2]} & \ldots & P^{(r-1)S[c-1]} \end{bmatrix}, \quad (1)$$

where I is p×p (p is a prime number) identity matrix, P is a p×p permutation matrix ($p_{i,i+i}+p_{p,1}=1$, i=1, 2, . . . , p−1; other elements of P are zeros), while r and c represent the number of rows and columns in (1), respectively, and S is a set of integers.

20. The method as recited in claim 19, wherein the set of integers are selected from a set $\{0, 1, \ldots, p-1\}$ so that cycles of short length in a corresponding (bipartite) graph representation of H are avoided.

21. A low density parity check (LDPC) decoder, comprising:
a log-likelihood ratio (LLR) module configured to compute log-likelihood ratios based on input sequences;
a digital to stochastic converter configured to initialize extrinsic probability information between variable nodes and check nodes in a bipartite graph by generating a Bernoulli sequence according to a probability of a bit having a value;
a parity checker configured to check parity in accordance with a parity check equation;
a parity node update logic circuit configured to update extrinsic information in check nodes from variable nodes in a first half iteration if the parity check equation is not satisfied;
a variable node update logic circuit configured to update extrinsic information in variable nodes from check nodes in a second half iteration if the parity check equation is not satisfied, the variable node update logic circuit further configured to update the variable nodes with a probability based upon the extrinsic information passed between check nodes and variable nodes wherein the probability represents a likelihood that an ith bit is a one; and
an output configured to pass information bits when the parity check equation is satisfied.

22. The decoder as recited in claim 21, wherein the parity node update logic circuit includes an EXOR gate, and the variable node update logic circuit includes AND gates and a latch to update the probability.

23. The method as recited in claim 21, wherein the second half iteration is performed with 2 or 3 bit precision.

24. The method as recited in claim 21, wherein checking parity includes checking whether a code word v satisfies the parity-check equation $vH^T=0$ (where H is a parity-check matrix) and a LDPC code with a girth of at least 10 is employed wherein the parity check-matrix H of quasi-cyclic LDPC codes is represented by:

$$H = \begin{bmatrix} I & I & I & \ldots & I \\ I & P^{S[1]} & P^{S[2]} & \ldots & P^{S[c-1]} \\ I & P^{2S[1]} & P^{2S[2]} & \ldots & P^{2S[c-1]} \\ \ldots & \ldots & \ldots & \ldots & \ldots \\ I & P^{(r-1)S[1]} & P^{(r-1)S[2]} & \ldots & P^{(r-1)S[c-1]} \end{bmatrix}, \quad (1)$$

where I is p×p (p is a prime number) identity matrix, P is a p×p permutation matrix ($p_{i,i+1}=p_{p,1}=1$, i=1, 2, . . . , p−1; other elements of P are zeros), while r and c represent the number of rows and columns in (1), respectively, and S is a set of integers.

25. The decoder as recited in claim 24, wherein the set of integers are selected from a set $\{0, 1, \ldots, p-1\}$ so that cycles of short length in a corresponding (bipartite) graph representation of H are avoided.

\* \* \* \* \*